United States Patent [19]
Leff et al.

[11] Patent Number: 5,382,791
[45] Date of Patent: Jan. 17, 1995

[54] DUAL MODE SWITCH FOR HANDICAPPED

[76] Inventors: Ruth B. Leff; Aaron N. Leff, both of 6589 N. Crestwood Dr., Milwaukee, Wis. 53209

[21] Appl. No.: 213,098

[22] Filed: Mar. 15, 1994

[51] Int. Cl.[6] .............................................. G01V 9/04
[52] U.S. Cl. .................................. 250/221; 250/208.4
[58] Field of Search .................. 250/221, 222.1, 208.4, 250/214 R, 214 SW; 200/61.01, 61.02, 318; 335/21

[56] References Cited

U.S. PATENT DOCUMENTS

| | | | |
|---|---|---|---|
| 1,844,117 | 2/1932 | DuMont | 361/182 |
| 1,929,273 | 10/1933 | Crago | 49/25 |
| 3,328,592 | 6/1967 | Shaw, II | 250/221 |
| 3,576,277 | 4/1971 | Blackmon | 222/1 |
| 3,621,268 | 11/1971 | Neckarhausen et al. | 250/221 |
| 4,165,890 | 8/1979 | Leff | 283/46 |
| 4,690,242 | 9/1987 | Mark | 200/61.01 |
| 4,761,633 | 8/1988 | Leff et al. | 340/286.07 |
| 4,954,083 | 9/1990 | Leff et al. | 434/112 |
| 5,016,003 | 5/1991 | Rice, Jr. et al. | 340/825.19 |
| 5,077,467 | 12/1991 | Barron, Jr. et al. | 250/221 |
| 5,103,085 | 4/1992 | Zimmerman | 250/221 |

Primary Examiner—David C. Nelms
Assistant Examiner—John R. Lee
Attorney, Agent, or Firm—Andrus, Sceales, Starke & Sawall

[57] ABSTRACT

A dual mode switch for use as a communication aid for the handicapped. The switch can be light activated or around activated, each have a momentary mode and a latching mode. In the momentary mode, the light switch is activated by a given change of impinging light from a first condition to a second condition, and the switch stays on as long as the light remains in the second condition, but turns off when the light returns to the first condition. In the latching mode, the switch stays on even after the light returns to the first condition, and turns off when the impinging light changes again to the second condition. The light switch is activated by moving a hand or other object over a photosensor to block or reduce impinging light, and the switch stays on as long as the hand is over the photosensor, but turns off when the hand is removed. In the latching mode, one pass of the hand turns the switch on, and another pass of the hand turns it off. In the momentary mode of the sound or voice switch, the switch is on only as long as a person keeps talking, and turns off when the person stops talking. In the latching mode, the voice switch stays on after the person stops talking, and turns off when the person starts talking again.

11 Claims, 2 Drawing Sheets

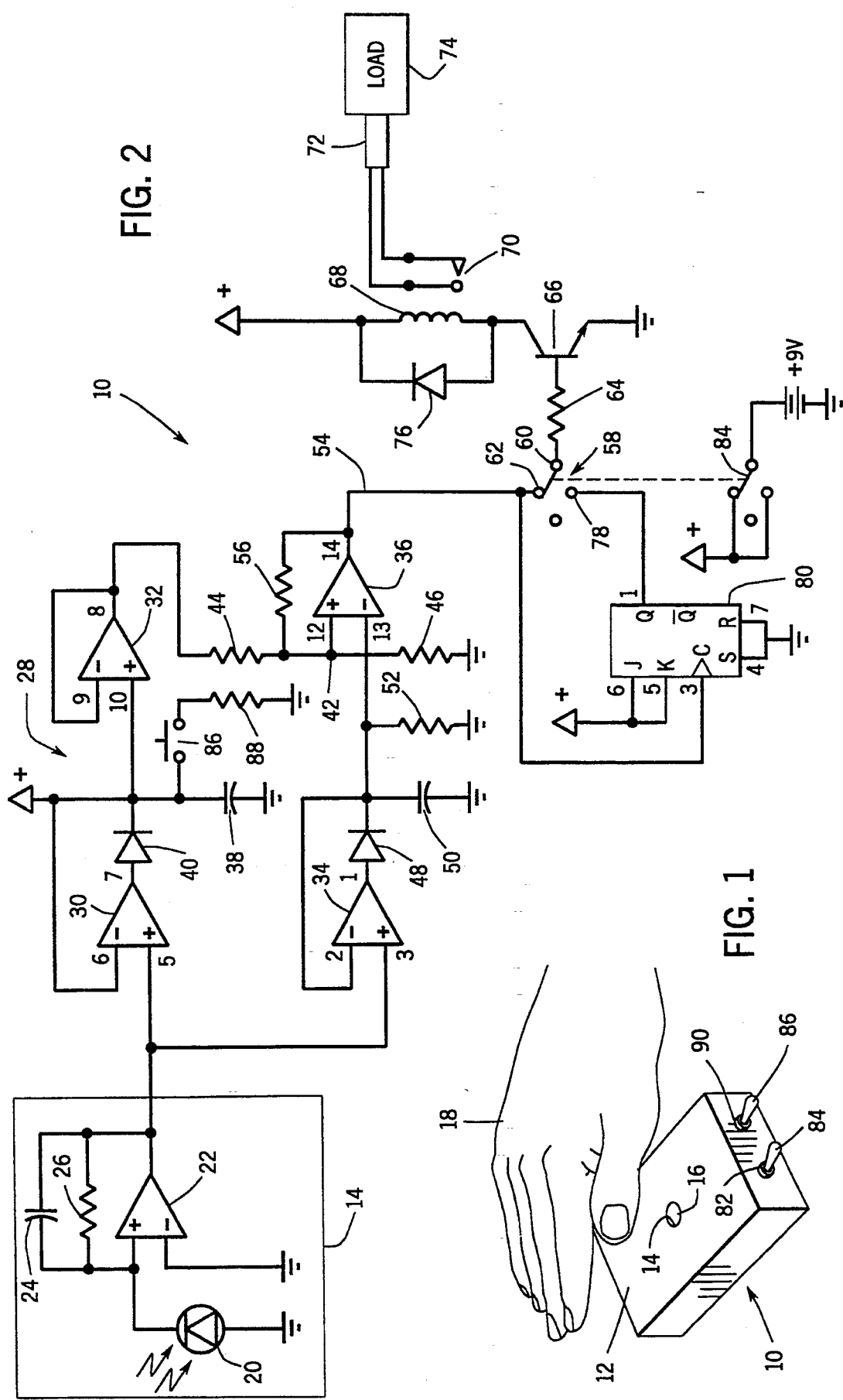

DUAL MODE SWITCH FOR HANDICAPPED

BACKGROUND OF THE INVENTION

People with oral communication problems, or those having physical or mental development disabilities, have difficulty in communicating their basic needs or wants to others. In the past, various types of communication aids have been developed to aid a handicapped person in expressing his or her needs. For example, U.S. Pat. No. 4,165,890 describes a communication aid utilizing a series of pictures or illustrations representing basic needs, and the illustrations are joined together on a ring. By selecting the proper illustration, the handicapped person can communicate his or her needs or wants to others. Devices of this type are helpful for people with communication difficulties, multiple sclerosis and other neurological disorders, mental retardation, voice, hearing or visual difficulties, or post operative problems.

Another form of communication aid, such as shown in U.S. Pat. No. 4,954,083, utilized by patients unable to verbally communicate and also unable to move their appendages, is a device in which a series of pictures or illustrations representing the needs of a patient are mounted on a transparent board around a center hole or opening. An attendant, holding the board and looking through the opening, can follow eye movement of the patient to one of the illustrations on the board to thereby determine the need of the patient.

Another type of communication aid is that shown in U.S. Pat. No. 4,761,633, which has particular use for handicapped persons who have movement of their arms or legs but are unable to verbally communicate. In this device a pointer is mounted for rotation on a generally flat surface of a housing and a series of pictures or illustrations, representing basic needs, are positioned on the housing surface. By depressing a push button on the housing the pointer is rotated and brought into registry with one of the illustrations on the housing to represent the need of the patient.

SUMMARY OF THE INVENTION

The invention is directed to a dual mode switch to be used as a communication aid for the handicapped. The switch is used to control power to an electrical load or appliance without physically contacting the switch.

In one form of the invention, the switch is light activated. The switch is selectively settable to operate either in a momentary mode or a latching mode. In the momentary mode, the switch turns on in response to impinging light, changing from a first condition to a second condition, and turns off when the light changes back from the second condition to the first condition. In the latching mode, the switch remains on even after the light changes back from the second condition to the first condition, and turns off when the light again changes from the first condition to the second condition.

In one embodiment, a light sensitive shadow switch is activated by moving a hand, appendage or other object over a photosensor, reducing the amount of light impinging the photosensor. In the momentary mode, the switch is on as long as the hand stays over the photosensor, and turns off when the hand is removed. In the latching mode, one pass of the hand over the photosensor turns the switch on, and another pass of the hand turns it off.

In another form of the invention, the switch is voice or sound sensitive. In the momentary mode, the switch will be on only as long as the person keeps talking, and turns off when the person stops talking. In the latching mode, the voice switch stays on after the person stops talking, and turns off when the person starts talking again.

In use, an attendant to the handicapped person will normally set the selection switch in either the momentary or latching mode depending upon the abilities of the handicapped person and the desired use of the device. The light actuated switch can be used by nonverbal persons who have the ability to move a hand or appendage to control or alter the light impinging a photosensor. The voice switch is useful for handicapped persons who cannot move their limbs or otherwise control or alter an impinging light, but have the ability to talk or make sounds.

In the latching mode, the light actuated switch and the voice switch can be used to turn on and turn off electrical appliances such as a television, radio, or the like which have been adapted for switch operation, while in the momentary mode, the switches can be used to actuate a beeper to summon help, to communicate with a device, such as shown in U.S. Pat. No. 4,761,633, and for training and therapy of the handicapped patient.

Other objects and advantages will appear in the course of the following description.

DESCRIPTION OF THE DRAWINGS

The drawings illustrate the best mode presently contemplated of carrying out the invention.

In the drawings:

FIG. 1 is a perspective view of a light sensitive shadow switch and module in accordance with the invention.

FIG. 2 is a circuit diagram of a shadow switch.

DESCRIPTION OF THE ILLUSTRATED EMBODIMENT

Figure 3:
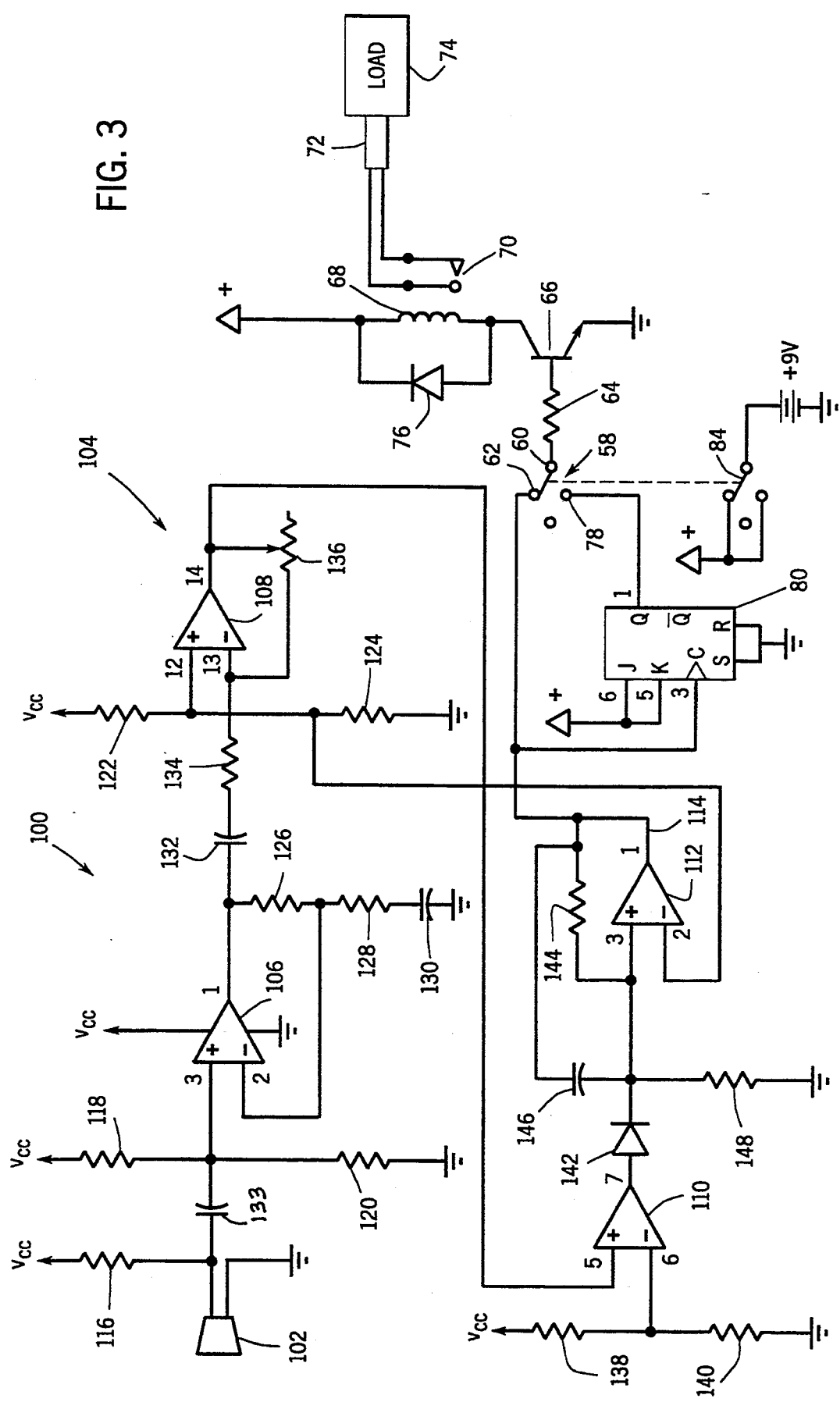
FIG. 3 is a circuit diagram of a voice switch.

FIG. 1 shows a shadow switch 10 housed in a module 12 having a first port 14 exposing a photosensor 16 for ease of waving a hand 18 thereover to reduce the amount of light impinging the photosensor. The photosensor is provided by a TSL250 optosensor, available from Texas Instruments, Inc., which includes a photo diode 20, FIG. 2, amplifier 22, and filter provided by capacitor 24 and resistor 26.

The output of photosensor 14 is supplied to detection circuitry 28 provided by a Texas Instruments TLC254CA operational amplifier circuit including operational amplifiers 30, 32, 34, and 36, and where manufacturer assigned pin number designations are shown for clarity. The output of photosensor 14 is supplied to the noninverting input of operational amplifier 30 which acts as a voltage follower and charges capacitor 38 through diode 40. Operational amplifier 32 is also a voltage follower and tracks the voltage across capacitor 38 which in turn represents the highest voltage attained during varying light intensity conditions, and thus functions as a sample and hold peak detector. The output of operational amplifier 32 is reduced to about two-thirds value at node 42 due to the voltage divider provided by resistors 44 and 46.

The output of photosensor 14 is also supplied to the noninverting input of operational amplifier 34 which is a voltage follower and provides an output through diode 48 to the inverting input of operational amplifier 36. Capacitor 50 and resistor 52 provide a smoothing filter to eliminate chatter in the downstream relay, to be described, under certain lighting conditions such as fluorescent light or other flickering or varying intensities. Operational amplifier 36 compares the voltage at its inverting input against that at its noninverting input from node 42, and outputs a trigger signal on line 54 in response to a given reduction of light impinging photosensor 14, i.e. when the voltage at the inverting input of operational amplifier 36 drops below the noted two-thirds value at its noninverting input from node 42. Feedback resistor 56 provides hysteresis so that the light intensity must increase to a higher value before output 54 transitions again.

A selection switch 58, normally actuated by an attendant to the handicapped person, is provided by a double-pole double-throw center-off switch. Switch 58 has a first condition connecting node 60 to node 62 and providing a momentary mode. In this mode, the trigger signal on line 54 is supplied through resistor 64 to the base of NPN bipolar transistor 66 to trigger the latter into conduction to conduct current through relay coil 68 to trip relay 70 and supply electrical power through plug-in connector 72 to an electrical load 74 to energize same. It is preferred that load 74 be adapted to include a female plug or receptacle receiving plug-in connector 72 and providing a bypass power supply circuit in parallel with the normal on-off switch of load 74 for energizing the load. Free wheeling diode 76 provides a discharge path upon turn-off to discharge the inductive current in coil 68. When switch 58 is in the noted first condition connecting node 60 to node 62, providing the noted momentary mode, the output switch provided by transistor 66 is actuated to its on state by the trigger signal on line 54, and is actuated to its off state in response to removal of the trigger signal due to increased light impinging photosensor 14, e.g. when hand 18 is moved away from port 16.

Switch 58 has a second condition disconnecting node 60 from node 62 and instead connecting node 60 to node 78, providing a latching mode. Node 78 is connected to the Q output of flip flop 80, provided by a Motorola 14027B J-K flip flop, where manufacturer assigned pin number designations are shown for clarity. The clock input of flip flop 80 is connected to line 54. Flip flop 80 operates in conventional manner, such that its Q output goes high in response to a trigger signal on line 54 at the clock input, and remains high after termination of the trigger signal. The Q output transitions low in response to a the next trigger signal on line 54 at the clock input. With switch 58 in the noted second condition connecting node 60 to node 78, providing the noted latching mode, transistor 66 is actuated to its on state by the trigger signal on line 54 clocking flip flop 80 to provide a high state on its Q output at node 78. Transistor 66 remains in its on state upon removal of the trigger signal on line 54 due to increased light impinging photosensor 14, e.g. when hand 18 is moved away from port 16. Transistor 66 is actuated to its off state in response to another trigger signal on line 54 due to reduced light impinging photosensor 14, e.g. by the next wave of hand 18 over port 16.

Module 12 has a second port 82 at which selection switch 58 is manually operator controlled by toggle lever 84 to provide operator selection between the momentary mode wherein transistor 66 stays in its on state as long as hand 18 is over port 16, and the latching mode wherein a first wave of hand 18 over port 16 actuates transistor 66 to its on state, and a second wave of hand 18 over port 16 actuates transistor 66 to its off state.

Selection switch 48 has a third condition disconnecting node 60 from node 62 and from node 78. This is the center-off position and provides an off mode disabling actuation of output transistor switch 66 by the trigger signal on line 54.

Detection circuitry 28 includes a sensitivity switch 86 setting current light intensity for comparison against the given reduction thereof for outputting the trigger signal. Upon closure of switch 86, capacitor 38 discharges through resistor 88, thus erasing previous peak held voltages, such that upon reopening of switch 86, operational amplifier 32 will now follow the new peak value to which capacitor 38 is charged through diode 40 from operational amplifier 30. Sensitivity switch 86 provides a reset function. Switch 86 is accessible at port 90 of module 12.

Voice switch 100, FIG. 3, includes a microphone 102. Detection circuitry 104 is provided by an LM324M amplifier circuit including operational amplifiers 106, 108, 110 and 112, responsive to microphone 102 and outputting a trigger signal on line 114 in response to a given sound increase. Operational amplifiers 106 and 108 provide first and second stages of amplification. Resistor 116 is a pull-up resistor, and resistors 118 and 120 provide a voltage divider, as do resistors 122 and 124. Resistors 126 and 128 and capacitor 130 provide filtering, as do capacitors 132 and 133 and resistor 134. Potentiometer 136 sets gain and provides sensitivity control. Operational amplifier 110 is a comparator and has a threshold reference provided through the voltage divider formed by resistors 138 and 140. The output of operational amplifier 110 through diode 142 is smoothed and filtered through resistor 144, capacitor 146 and resistor 148, to provide an average intensity of the speaker's voice. Operational amplifier 112 provides final stage amplification and outputs the trigger signal on line 114. The balance of the voice switch circuit is comparable to the above described shadow switch circuit, and like reference numerals are used as above to facilitate clarity, with the noted trigger signal in FIG. 2 being supplied on line 54, and the noted trigger signal in FIG. 3 being supplied on line 114.

It is recognized that various equivalents, alternatives and modifications are possible within the scope of the appended claims. For example, the light activated switch may be modified to produce the trigger signal on line 54 in response to a given increase in light impinging photosensor 20, e.g. by reversing the connections to pins 12 and 13 of operational amplifier 36. This latter alternative would be useful for handicapped people who cannot move an arm or leg, but can turn their head, wherein a focused light beam source, e.g. a laser, may be attached to the brim of a hat or other headgear to be worn by a patient such that when he turns his head the light beam will be focused on photosensor 20.

Various modes of carrying out the invention are contemplated as being within the scope of the following claims particularly pointing out and distinctly claiming the subject matter which is regarded as the invention.

We claim:

1. A light responsive control switch comprising:
   a photosensor;
   detection circuitry responsive to said photosensor and outputting a trigger signal when light impinging said photosensor changes from a first condition to a second condition;

a selection switch having a first condition comprising a momentary mode, and a second condition comprising a latching mode;

an output switch actuated by said trigger signal between first and second states for controlling energization of a load, such that when said selection switch is in said first condition, said output switch is actuated to said first state by said trigger signal, and is actuated to said second state in response to removal of said trigger signal due to said impinging light changing from said second condition to said first condition, and when said selection switch is in said second condition, said output switch is actuated to said first state by said trigger signal and remains in said first state upon removal of said trigger signal due to said impinging light changing from said second condition to said first condition, and is actuated to said second state in response to another trigger signal due to said impinging light changing from said first condition to said second condition.

2. The invention according to claim 1 wherein said detection circuitry comprises a sensitivity switch setting current light intensity for comparison against a given change thereof for outputting said trigger signal.

3. The invention according to claim 2 wherein said selection switch has a third condition comprising an off mode disabling actuation of said output switch by said trigger signal.

4. A shadow switch comprising:
a photosensor;
detection circuitry responsive to said photosensor and outputting a trigger signal in response to a given reduction of light impinging said photosensor;
a selection switch having a first condition comprising a momentary mode, and a second condition comprising a latching mode;
an output switch actuated by said trigger signal between first and second states for controlling energization of a load,
such that when said selection switch is in said first condition, said output switch is actuated to said first state by said trigger signal, and is actuated to said second state in response to removal of said trigger signal due to increased light impinging said photosensor,
and when said selection switch is in said second condition, said output switch is actuated to said first state by said trigger signal and remains in said first state upon removal of said trigger signal due to increased light impinging said photosensor, and is actuated to said second state in response to another trigger signal due to reduced light impinging said photosensor.

5. The invention according to claim 4 wherein said shadow switch is housed in a module having a first port exposing said photosensor for ease of waving a hand thereover to reduce the amount of light impinging said photosensor, and a second port at which said selection switch is manually operator controlled to provide operator selection between
said momentary mode wherein said output switch stays in said first state as long as said hand is over said first port, and changes to said second state when said hand is moved away from said first port,
and said latching mode wherein a first wave of said hand over said first port actuates said output switch to said first state, and said output switch remains in said first state after said hand is moved away from said first port, and wherein a second wave of said hand over said first port actuates said output switch to said second state.

6. The invention according to claim 5 wherein said module has a third port, and wherein said detection circuitry comprises a sensitivity switch at said third port setting current light intensity for comparison against a given reduction thereof for outputting said trigger signal, such that reduced light impinging said photosensor due to a hand waving over said first port is compared against the then current light intensity.

7. The invention according to claim 5 wherein said selection switch has a third condition comprising an off mode disabling actuation of said output switch by said trigger signal.

8. A voice switch comprising:
a microphone;
detection circuitry responsive to said microphone and outputting a trigger signal in response to a given sound increase at said microphone;
a selection switch having a first condition comprising a momentary mode, and a second condition comprising a latching mode;
an output switch actuated by said trigger signal between first and second states for controlling energization of a load,
such that when said selection switch is in said first condition, said output switch is actuated to said first state by said trigger signal, and is actuated to said second state in response to removal of said trigger signal due to reduced sound at said microphone,
and such that when said selection switch is in said second condition, said output switch is actuated to said first state by said trigger signal and remains in said first state upon removal of said trigger signal due to reduced sound at said microphone, and is actuated to said second state in response to another trigger signal due to increased sound at said microphone.

9. The invention according to claim 8 wherein said selection switch is manually operator controlled to provide selection between
said momentary mode wherein said output switch stays in said first state as long as the operator keeps talking, and changes to said second state when the operator stops talking,
and said latching mode wherein the voice of the operator actuates said output switch to said first state, and said output switch remains in said first state when the operator stops talking, and wherein said output switch is actuated to said second state when the operator begins talking again.

10. The invention according to claim 9 wherein said detection circuitry comprises a sensitivity switch for setting voice level.

11. The invention according to claim 9 wherein said selection switch has a third condition comprising an off mode disabling actuation of said output switch by said trigger signal.

* * * * *